US005956829A

United States Patent [19]

Kitahara et al.

[11] Patent Number: 5,956,829

[45] Date of Patent: *Sep. 28, 1999

[54] METHOD OF MANUFACTURING AN INK JET RECORDING HEAD

[75] Inventors: Kohei Kitahara; Toshiki Usui; Tomoaki Abe; Keiichi Mukaiyama, all of Nagano, Japan

[73] Assignee: Seiko Epson Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/660,958

[22] Filed: Jun. 12, 1996

Related U.S. Application Data

[62] Division of application No. 08/294,352, Aug. 23, 1994, Pat. No. 5,856,837.

[30] Foreign Application Priority Data

Aug. 23, 1993 [JP] Japan .................................... 5-207972
Nov. 29, 1993 [JP] Japan .................................... 5-298477

[51] Int. Cl.[6] .................................................... H01L 41/22

[52] U.S. Cl. ......................... 29/25.35; 310/328; 310/365; 347/70

[58] Field of Search ............................. 29/25.35; 347/20, 347/40, 68.72, 94; 310/328, 358, 365, 366

[56] References Cited

U.S. PATENT DOCUMENTS

| | | |
|---|---|---|
| 2,224,520 | 1/1940 | Matsuda . |
| 4,680,595 | 7/1987 | Cruz-Uribe . |
| 4,766,671 | 8/1988 | Utsumi et al. . |
| 5,045,744 | 9/1991 | Ando et al. . |
| 5,376,857 | 12/1994 | Takeuchi et al. . |

FOREIGN PATENT DOCUMENTS

| | | |
|---|---|---|
| 0083877 | 7/1983 | European Pat. Off. . |
| 0572230A2 | 5/1993 | European Pat. Off. . |
| A2 0600743 | 6/1994 | European Pat. Off. . |
| 0615294 | 9/1994 | European Pat. Off. . |
| 0723867A2 | 7/1996 | European Pat. Off. . |
| 3427850 | 2/1985 | Germany . |
| 6422556 | 1/1989 | Japan . |
| 5-29675 | 2/1993 | Japan . |
| 5-49270 | 2/1993 | Japan . |
| 5-97437 | 4/1993 | Japan . |

*Primary Examiner*—Carl E. Hall
*Attorney, Agent, or Firm*—Sughrue, Mion, Zinn, Macpeak & Seas, PLLC

[57] ABSTRACT

An ink jet recording head including a vibrating plate made of ceramic, a pressure producing chamber forming member, made of ceramic, for forming a plurality of pressure producing chambers in rows, and drive electrodes formed on a surface of the vibrating plate so as to confront the pressure producing chambers. A width W2 of each drive electrode is smaller than a width W1 of each pressure producing chamber. A width W3 of a piezoelectric vibrating element is larger than the width W2 of each drive electrode and smaller than the width W1 of each pressure producing chamber, so that an operation region of the piezoelectric vibrating element is regulated by the width W2 of the drive electrode, and peripheral portions of the piezoelectric vibrating element are reliably bonded to peripheral portions of the drive electrode.

14 Claims, 12 Drawing Sheets

METHOD OF MANUFACTURING AN INK JET RECORDING HEAD

This is a divisional of application Ser. No. 08/294,352 filed Aug. 23, 1994, now U.S. Pat. No. 5,856,837.

BACKGROUND OF THE INVENTION

1. Field of the Invention

The invention relates to an on-demand ink jet recording head that forms characters and graphics on a recording medium with dots by expelling ink droplets thereto in accordance with input information. More particularly, the invention is directed to a structure having electrodes and piezoelectric vibrating elements formed on a surface of a vibrating plate as well as to a method of manufacturing such structure. The vibrating plate constitutes part of the pressure producing chambers. The electrodes and the piezoelectric vibrating elements are formed integrally with the pressure producing chambers by baking.

2. Related Art

An ink jet recording head has a structure such that an ink droplet is expelled by causing a piezoelectric element to be abutted against a small pressure producing chamber and increasing the pressure of ink within the pressure producing chamber by displacement of a vibrating plate. As a result, precision working and fabricating techniques are required in the manufacture of the ink jet recording head, which elevates the cost.

To overcome this problem, a structure shown in FIG. 19 has been proposed attaching importance to the fact that the piezoelectric vibrating element, the vibrating plate constituting the pressure producing chamber, and the pressure producing chamber forming member can be made of ceramic. That is, a vibrating plate 90 formed by rolling a green sheet, which is a ceramic material, to a predetermined thickness and a pressure producing chamber forming member 94 having a pressure producing chamber 91 formed in advance by punching or machining a green sheet with a laser beam, which is also a ceramic material, are pressed and baked. Then, an electrode 93 is formed on the vibrating plate 90 and a piezoelectric vibrating element 92 is formed on the electrode 93 by baking.

Such an integrally baked ink jet recording head has the advantage of simple fabrication that involves only the steps of coating and baking a paste-like piezoelectric element by means of a printing technique. Further, since the pressure producing chamber forming member is integrated with the vibrating plate by baking, defective bonding such as observed in bonds formed by adhesives can be eliminated, which is an advantage in reliably preventing ink leakage.

However, the piezoelectric vibrating element, being such a small piece, is hard to uniformly coat to the corresponding drive electrode. Particularly, inconsistency in the bond of each piezoelectric vibrating element 92 with a peripheral edge 95 of the electrode 93 leads to inconsistency in the effective operation region between the piezoelectric vibrating elements, which in turn causes inconsistency in the ink expelling characteristic of each nozzle opening.

By the way, in the steps of depositing the electrode 93 on the surface of the vibrating plate 90, which is made of ceramic, and depositing the piezoelectric vibrating element 92 on the surface of the electrode 93 by baking, the vibrating plate 90 generally flexes as shown in FIG. 20. That is, the vibrating plate 90 flexes toward the pressure producing chamber 91 at a central portion of the pressure producing chamber 91 due to a difference in the rate of contraction between the piezoelectric vibrating element 92 and the electrode 93 at the time of baking. As a result, a permanent deformation in which a part 92*a* (the cross-hatched region in FIG. 20) of the lower region of the piezoelectric vibrating element 92 projects toward the pressure producing chamber 91 tends to occur.

When the piezoelectric vibrating element 92 that has been deformed is caused to contract for expelling ink by applying a drive signal thereto, contracting forces in such horizontal directions indicated by arrows A1, A1 are generated as far as to the part 92*a* of the lower region, thereby drawing in the horizontal directions the vibrating plate 90 that has already been flexed. As a result, a part of the contracting force draws walls 94*a*, 94*b* of the pressure producing chamber forming member 94 in directions indicated by arrows C1, C2 through the vibrating plate 90. Since the walls 94*a*, 94*b* of the pressure producing chamber forming member 94 are shared in common with the adjacent pressure producing chambers 91, the contraction of a single pressure producing chamber 91 is transmitted to other pressure producing chambers 91, causing crosstalk or cancelling out a force B1 that contributes to the ink expelling operation when adjacent piezoelectric vibrating elements 92, 92 are driven simultaneously, which impairs ink expelling efficiency.

The displacement of the vibrating plate 90 in the case where a single piezoelectric element is driven is different from that in the case where a plurality of adjacent piezoelectric vibrating elements 92 are driven simultaneously, the difference being approximately twice. This causes differences in the ink droplet expelling speed and the amount of ink expelled, the differences being approximately 1.5 times.

SUMMARY OF THE INVENTION

A first object of the invention is to provide an ink jet recording head adapted to be manufactured by baking, the ink jet recording head being capable of providing consistent ink expelling performance among the nozzle openings by reliably bonding the piezoelectric vibrating elements to the electrodes formed on the vibrating plate and thereby making the effective operation regions of the piezoelectric vibrating elements uniform.

A second object of the invention is to provide an ink jet recording head adapted to be manufactured by baking, the ink jet recording head being capable of preventing crosstalk by controlling generation of divided forces that flex the walls of a pressure producing chamber and improving ink expelling efficiency independent of the deformation of the vibrating plate at the time of baking.

A third object of the invention is to propose a method of manufacturing the above-mentioned ink jet recording heads.

An ink jet recording head of the invention includes: a vibrating plate made of ceramic; a pressure producing chamber forming member, made of ceramic, for forming a plurality of pressure producing chambers in rows; an electrode on one pole formed on a surface of the vibrating plate so as to correspond to the pressure producing chamber; and a piezoelectric vibrating element, one end thereof contacting the electrode and other end thereof contacting an electrode on other pole; and expells an ink droplet from a nozzle opening by flexion of the piezoelectric vibrating element. In such an ink jet recording head, at least the vibrating plate and the pressure producing chamber forming member are integrally formed by baking the ceramic; the piezoelectric vibrating element is deposited by baking on the surface of the electrode on the one pole formed on the surface of the vibrating plate; a width W2 of the electrode on the one pole is smaller than a width W1 of the pressure producing chamber; and a width W3 of the piezoelectric vibrating element is larger than the width W2 of the electrode on the one pole and smaller than the width W1 of the pressure producing chamber.

Since the width W3 of the piezoelectric vibrating element formed on the vibrating plate is larger than the width of the electrode, the piezoelectric vibrating element can be bonded to the peripheral edges of the electrode reliably. Further, since the width W3 is smaller than the width W1 of the pressure producing chamber, the piezoelectric vibrating element is free from interference from the noncontracting regions.

DETAILED DESCRIPTION OF THE PREFERRED EMBODIMENTS

Figure 1:
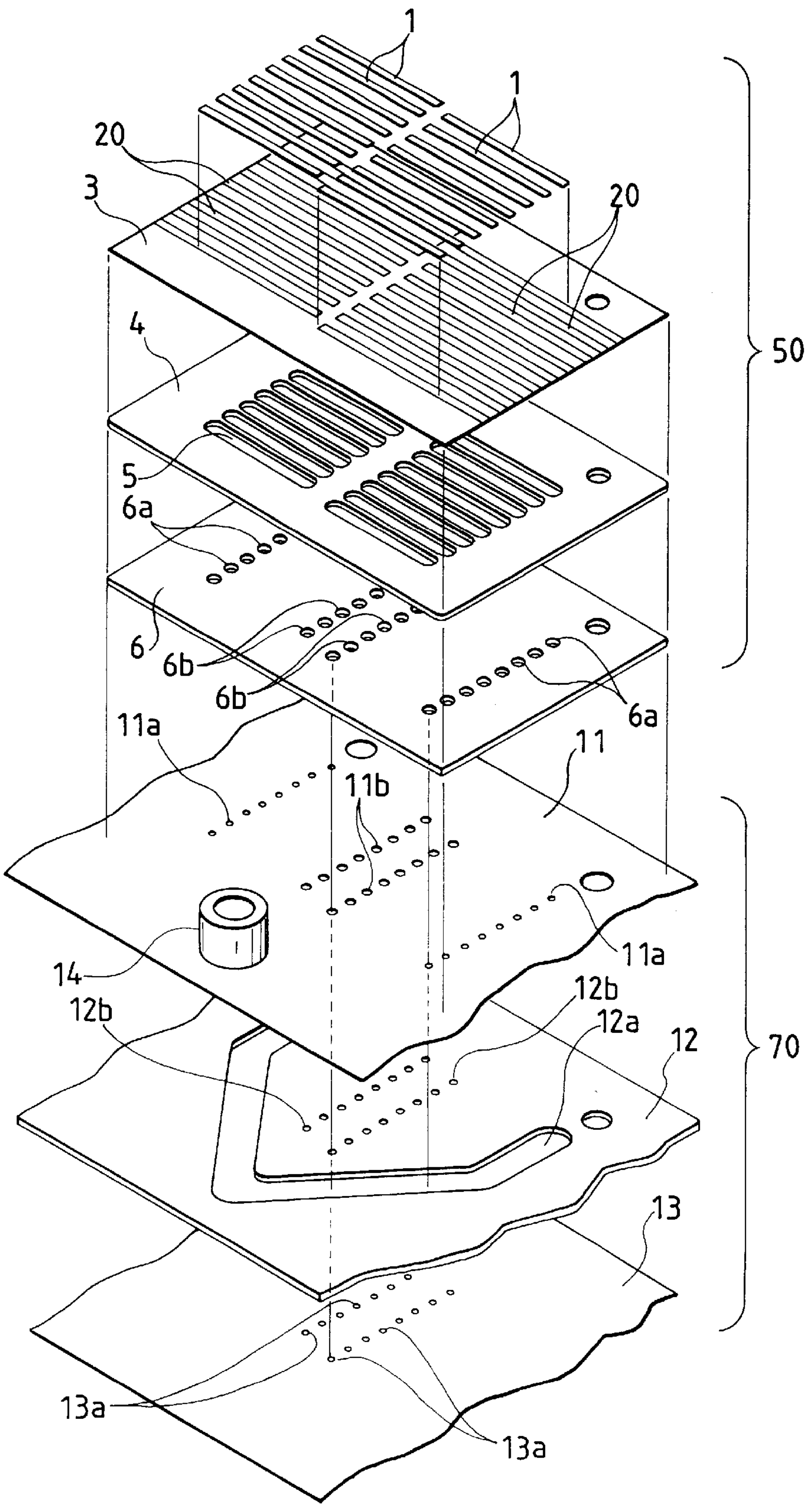
FIG. 1 is an exploded perspective view showing an ink jet recording head, which is an embodiment of the invention.

The invention will now be described in detail with reference to the embodiments shown in the drawings.

FIG. 1 shows an ink jet recording head, which is an embodiment of the invention, to which the electrode structure of the invention is applied. In FIG. 1 reference numeral 3 denotes a vibrating plate made of a material, at least the surface of which is electrically insulating, more preferably, of ceramic. On the surface of the vibrating plate 3 are drive electrodes 20, which will be described later. The drive electrodes are arranged so as to correspond to a plurality of rows of pressure producing chambers 5, 5, 5, •• •• (two (2) rows in this embodiment). Reference numeral 1 denotes a piezoelectric vibrating element that is made of ceramic and has a piezoelectric property. The piezoelectric vibrating elements 1 flex toward the vibrating plate 3 through the drive electrodes 20, 20, 20 •• •• so that the back surfaces thereof come in contact with the drive electrodes 20, 20, 20 •• ••. Reference numeral 4 denotes a pressure producing chamber forming member, which is made of a plate that is so thick as to form the pressure producing chambers 5, 5, 5 •• ••, more preferably, of a ceramic plate, by boring through holes therein. Reference numeral 6 denotes a pressure producing chamber forming cover member, which serves to seal the other surface of the pressure producing chambers 5 of the pressure producing chamber forming member 4. At positions corresponding to the vicinity of both ends of the pressure producing chambers 5 are introducing holes 6*a*, 6*a*, 6*a* •• •• and introducing holes 6*b*, 6*b*, 6*b* •• ••. The introducing holes 6*a*, 6*a*, 6*a* •• •• communicate with a common ink chamber 12*a*, which will be described later, and the introducing holes 6*b*, 6*b*, 6*b* •• •• communicate with nozzle openings 13*a*, 13*a*, 13*a* •• ••.

The vibrating plate 3 having both the piezoelectric vibrating elements 1 and the drive electrodes 20, the pressure producing chamber forming member 4, and the pressure producing chamber forming cover member 6 are collected into a small group having two (2) rows of nozzle openings, all these members being preferably made of ceramic, and integrated by baking into a pressure producing unit 50.

Reference numeral 11 denotes an ink supply section forming member. The ink supply section forming member 11 includes: an ink introducing inlet 14 that supplies ink into the ink chamber 12*a* and is connected to a flow path from an ink tank (not shown); introducing through holes 11*a* that connect the pressure producing chambers 5 to the common ink chamber 12*a*; and introducing through holes 11*b* that connect the pressure producing chambers 5 to the nozzle openings 13*a*.

Reference numeral 12 denotes a reservoir forming member that forms the common ink chamber 12*a*. In this embodiment the common ink chamber 12*a* is formed by a through hole that is substantially V-shaped, and is connected to the respective pressure producing chambers 5 through the introducing through holes 6*a* of the above-mentioned pressure producing chamber forming cover member 6 and the introducing through holes 11*a* of the ink supply section forming member 11. Introducing through holes 12*b* that connect the pressure producing chambers 5 to the nozzle openings 13*a* are formed at a central portion of the reservoir forming member 12.

Reference numeral 13 denotes a nozzle forming member. The nozzle forming member 13 is connected to the pressure producing chambers 5 through the introducing through holes 6*b*, 11*b*, 12*b*, and also performs the function of sealing the other side of the common ink chamber 12 of the reservoir forming member 12.

The ink supply section forming member 11 and the nozzle forming member 13 are formed by press working or etching a rustproof steel sheet. These members may be made of at least one material selected from the group consisting of other metals, ceramics, glass, silicon, and plastics. The method of working the respective members includes: press working, etching, electroforming, and laser beam machining. At any rate, a material having a relatively high Young's modulus is selected for the ink supply section forming member 11 and the nozzle forming member 13.

On the other hand, the reservoir forming member 12 may be made of not only the above-mentioned metals, ceramics, glass, and silicon, but also a plastic- or film-like adhesive or paste-like adhesive such as polyimide, polyamide, polyester, polyethylene, polypropylene, polyvinyl chloride, and polyvinylidene chloride, since a lower rigidity is required for the reservoir forming member 12. When the plastic- or film-like adhesive is used, the reservoir forming member 12 is formed by injection molding or press working. When the paste-like adhesive is used, the reservoir forming member 12 is formed by screen printing or transfer printing.

The ink supply section forming member 11, the reservoir forming member 12, and the nozzle forming member 13 are formed into a flow path unit 70 that has the function of fixing a plurality of pressure producing units 50.

A method of bonding these members into a flow path unit is as follows. If the reservoir forming member 12 itself has no adhesion, the film-like adhesive or the paste-like adhesive is used, and the ink supply section forming member 11, the adhesive, the reservoir forming member 12, the adhesive, and the nozzle forming member 13 are laminated one upon another in this order using a positioning jig (not shown), and thermocompressed or compressed. On the other hand, if the reservoir forming member 12 itself has adhesion, the ink supply section forming member 11, the reservoir forming member 12, and the nozzle forming member 13 are laminated one upon another in this order and similarly thermocompressed or compressed.

Figure 2:
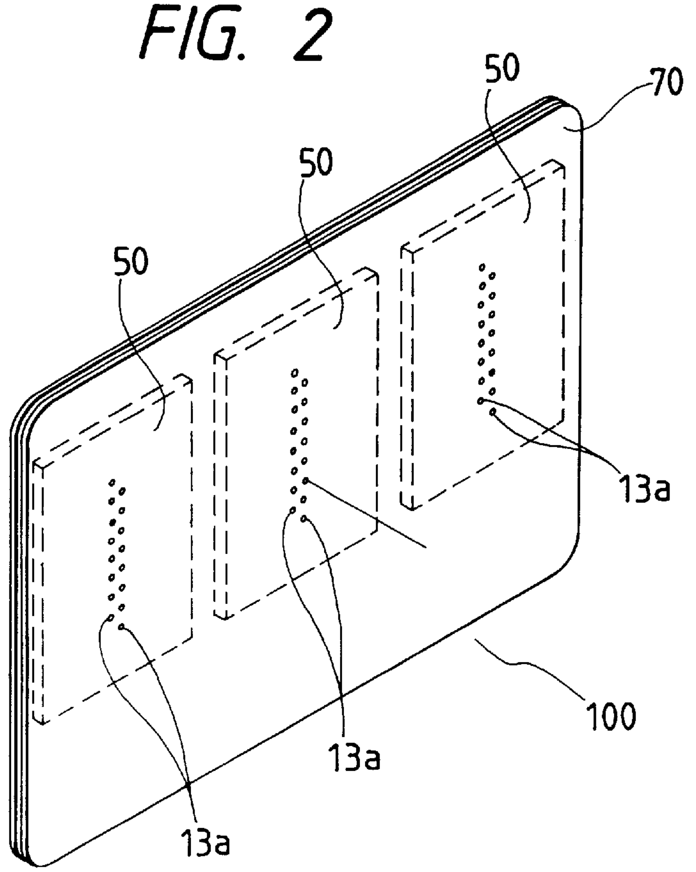
FIG. 2 is a perspective view outlining the ink jet recording head of the invention.

As a result, a single sheet of flow path unit 70 as shown in FIG. 2 has a plurality of pressure producing units 50, namely, three (3) pressure producing units 50, 50, 50 in this particular embodiment, collectively fixed thereto by the adhesive, thermodeposition film, or the like to form an ink jet recording head.

Figure 3:
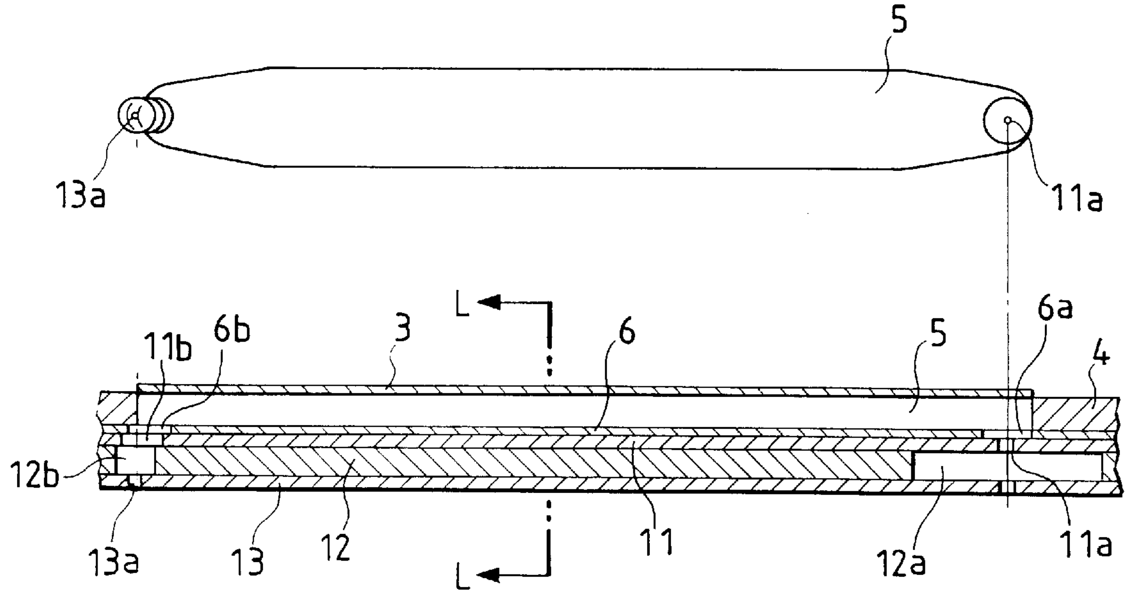
FIG. 3 is an enlarged sectional view showing the shape of the upper surface of a pressure producing chamber and the longitudinal section thereof in the ink jet recording head.
Figure 4:
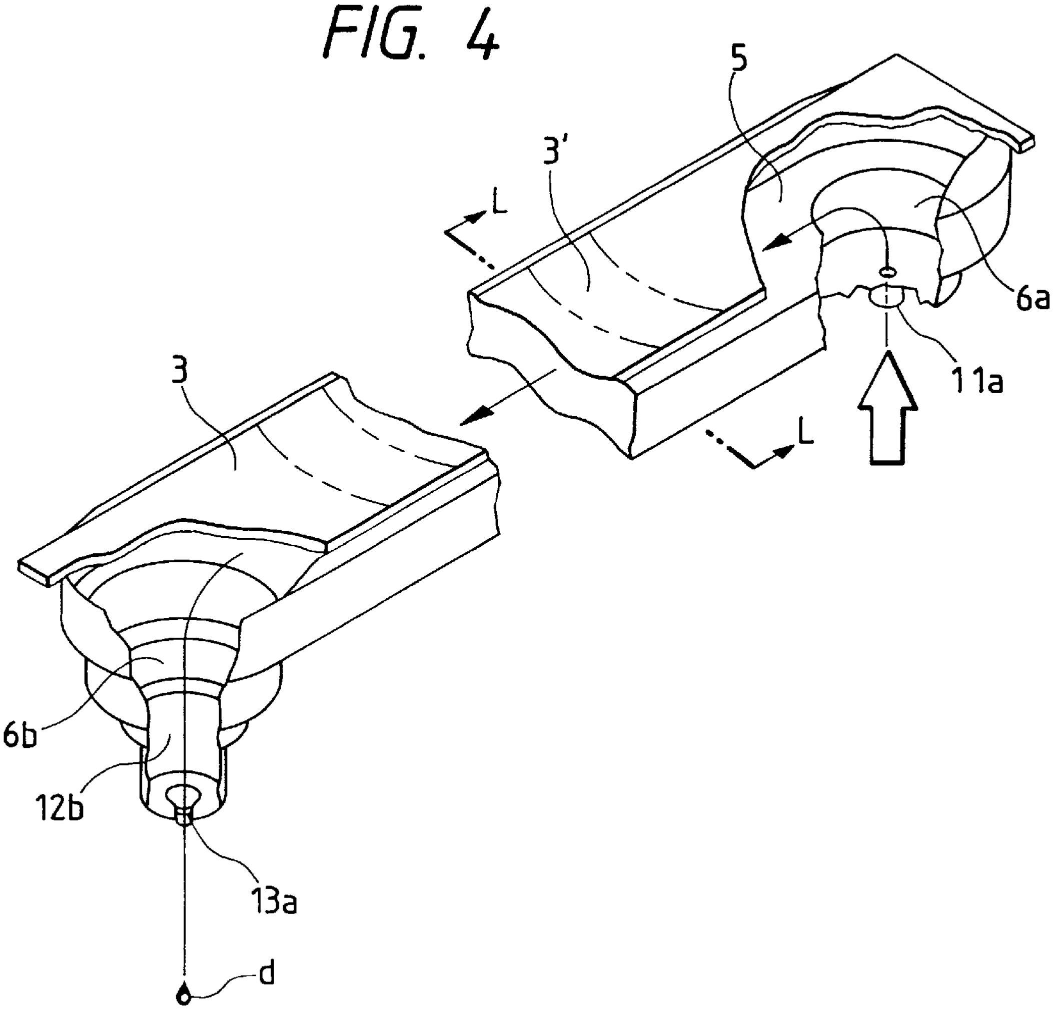
FIG. 4 is a partially sectional perspective view showing the structure of the pressure producing chamber.

The thus formed pressure producing chambers 5 of the ink jet recording head are substantially rectangular, slender chambers such as shown in FIG. 3. The nozzle opening 13*a* communicates with one end of each pressure producing chamber 5, and the common ink chamber 12 communicates with the other end thereof. As shown in FIG. 4, with the piezoelectric vibrating element 1 vibrating by flexion, the vibrating plate 3 is deformed so that the vibrating plate 3 projects toward the pressure producing chamber 5 as indicated by a curve 3'. As a result, the pressure of the pressure producing chamber 5 increases to jet an ink droplet "d" from the nozzle opening 13*a* and thereby form a dot on a recording sheet. Upon return of the piezoelectric vibrating element 1 to the original conditions, the ink flows from the common ink chamber 12*a* via the introducing through hole 11*a*. As a result, a stream of ink in such a longitudinal direction as indicated by the arrows in FIG. 4 is produced within the pressure producing chamber 5.

Figure 5:
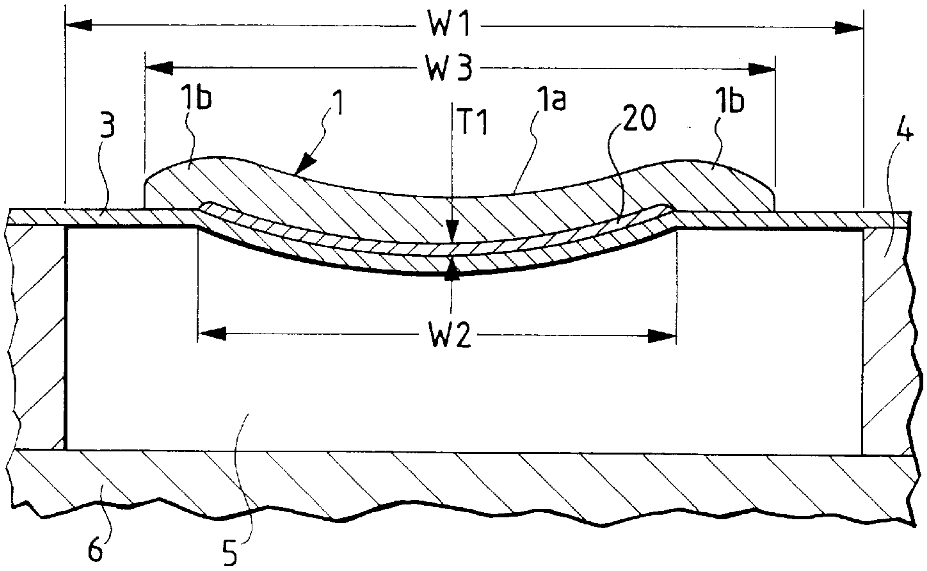
FIG. 5 is a diagram showing the structure having a drive electrode and a piezoelectric vibrating element, which is the feature of the invention, in section taken along a line L—L of FIG. 4.
Figure 6A:
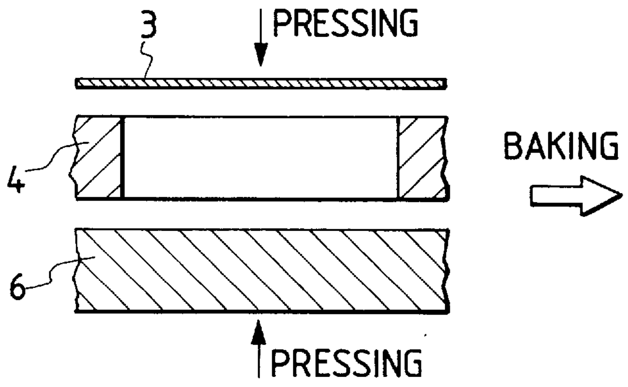
FIGS. 6 (*a*) to (*f*) are diagrams showing a method of manufacturing a pressure producing unit used in the ink jet recording head of the invention.
Figure 6B:
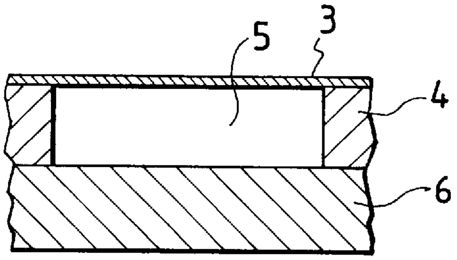
Figure 6C:
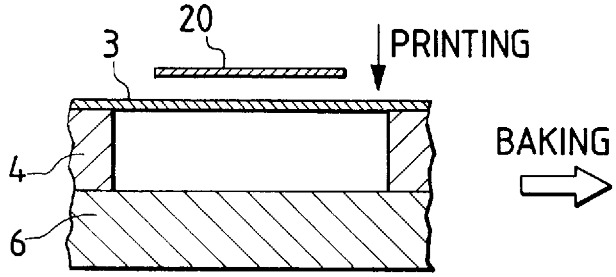
Figure 6D:
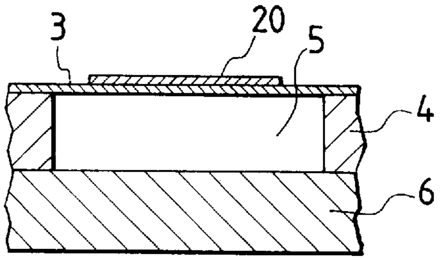
Figure 6E:
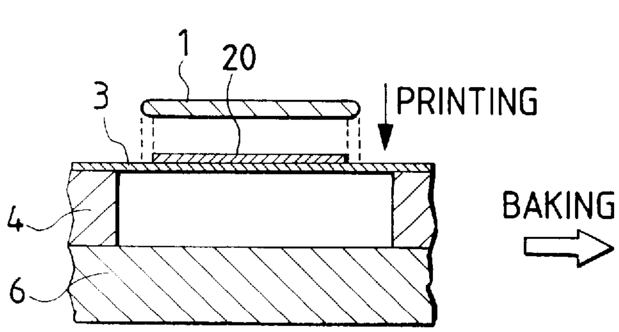
Figure 6F:
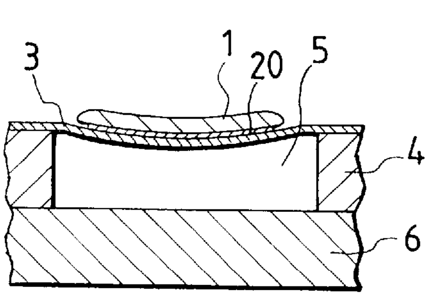

FIG. 5 shows in section a structure of the thus constructed ink jet recording head in the vicinity of the pressure producing chamber as viewed in a direction orthogonal to the stream of ink within the pressure producing chamber 5, or as taken along a line L—L of FIG. 4. In FIG. 5 reference numeral 20 denotes the drive electrode formed on the surface of the vibrating plate 3. The width W2 of the drive electrode 20 is slightly smaller than the width W1 of the pressure producing chamber 5, and the drive electrode 20 is formed so as to have a length so that one end thereof reaches an end portion of the vibrating plate 3 from the vicinity of the nozzle opening 13*a* of the pressure producing chamber 5, and the other end thereof serves also as the connecting terminal with an outer electrode.

Reference numeral 1 denotes the piezoelectric vibrating element, whose width W3 is larger than the width W2 of the drive electrode 20 and smaller than the width W1 of the pressure producing chamber 5. Having such a length that the front end thereof on the nozzle opening side covers the drive electrode 20 and the rear end thereof reaches the vicinity of the rear end of the pressure producing chamber 5, the piezoelectric vibrating element 1 is also formed so as to cover completely the region of the drive electrode 20 confronting the pressure producing chamber 5.

By forming the piezoelectric vibrating element 1 so as to cover the region of the drive electrode 20 confronting the pressure producing chamber 5, the region of the drive electrode 20 confronting the pressure producing chamber 5 can be covered completely by the piezoelectric vibrating element 1 even if the piezoelectric vibrating element 1 is subjected to slight displacement or sized inconsistently when formed. This prevents short circuiting with a common electrode 80 (FIG. 7) on the other pole which is formed on the surface of the piezoelectric vibrating element 1.

In the case where the piezoelectric vibrating element 1 is formed by coating or bonding the green sheet, which is a piezoelectric material, to the drive electrode 20 and baking the green sheet together with the vibrating plate 3 and the drive electrode 20, the piezoelectric vibrating element 1 covers the drive electrode 20 completely and has the peripheral edge portion 1*b* bonded to the drive electrode 20 reliably against contraction of the piezoelectric vibrating element 1 and flexion of the vibrating plate 3 during the baking process. Therefore, displacement due to flexing of the piezoelectric vibrating element 1 can be transmitted to the vibrating plate 3 reliably, and fatal damage such as partial flaking or the like can be prevented due to the reliable bond between the piezoelectric vibrating element 1 and the vibrating plate 3.

The area of the drive electrode 20 itself is used as the effective operation region of the piezoelectric vibrating element 1 since the piezoelectric vibrating element 1 is deposited so as to cover the drive electrode 20 in this invention. As a result, a piezoelectric vibrating element 1 that has an optimal effective operation region with respect to the pressure producing chamber 5 can be formed with ease by adjusting the size of the drive electrode 20 which is thin and can be formed highly accurately with ease. Such adjustment is easier to make than the adjustment of the size of the piezoelectric vibrating element 1 which is comparatively thick.

In addition, to improve displacement efficiency of the vibrating plate 3, i.e., the ratio of the applied electric energy to the ink removing volume, it is ideal to adjust the ratio of the width W1 of the pressure producing chamber 5 to the width W2 of the drive electrode 20, W2/W1, to 0.9. However, such ratio may be set to a value between 0.8 and 0.9 considering errors and variations in the manufacturing process.

Specifically, a drive electrode 20, whose width W2 is 340 $\mu$m and whose thickness is 5 $\mu$m which is sufficient to ensure electric conduction to be ensured with respect to a pressure producing chamber having a width W1 of 420 $\mu$m, is formed, and then a piezoelectric vibrating element 1, whose width W3 is 380 μm and whose thickness is 30 μm, is formed on the surface of the drive electrode 20.

A method of manufacturing the thus constructed ink jet recording head will be described next.

FIGS. 6 (*a*) to (*f*) are diagrams showing a method of manufacturing the above-mentioned pressure producing unit 50, the method being an embodiment of the invention. The vibrating plate 3, the pressure producing chamber forming member 4 or "pressure chamber forming member", and the pressure producing chamber forming cover member 6 or "cover member" are formed of green sheets, each green sheet being a ceramic material, i.e., a clay-like sheet, and the pressure producing chamber forming member 4 having windows formed at regions designed to serve as the pressure producing chambers 5 by punching; and pressure is applied to the green sheets with these members half-solidified so that these members are integrated with one another, in FIG. 6 (*a*). Then, the thus processed body is baked at temperatures ranging from 800 to 1500° C., in FIG. 6 (*b*). The ceramic material generally consists essentially of one kind or more of a compound selected from the group consisting of aluminum oxide, zirconium oxide, magnesium oxide, aluminum nitride, and silicon nitride.

When the vibrating plate 3, the pressure producing chamber forming member 4, and the pressure producing chamber forming cover member 6 have been integrated, a pattern of the drive electrode 20 having an optimal width with respect to the corresponding pressure producing chamber 5 is formed by coating or printing an electrically conducting material to a region corresponding to the pressure producing chamber 5 of the vibrating plate 3 so that the ratio of the width W2 of the drive electrode 20 to the width W1 of the pressure producing chamber 5, W2/W1, is set to a value between 0.8 and 0.9, in FIG. 6 (*c*). The electrically conducting material consists essentially of one kind or more of alloy selected from the group consisting of platinum, palladium, silver-palladium, silver-platinum, and platinum-palladium.

As the pattern of the drive electrode 20 has been half-solidified on the vibrating plate 3, the whole body is baked at a temperature suitable for baking the electrically conducting material, in FIG. 6 (*d*).

Then, the piezoelectric vibrating element 1 is formed on the surface of the drive electrode 20 by coating or printing a green sheet consisting of a piezoelectric material so that the width W3 of the piezoelectric vibrating element 1 is larger than the width W2 of the drive electrode 20 formed on the surface of the vibrating plate 3 and smaller than the width W1 of the pressure producing chamber 5, in FIG. 6 (*e*). The piezoelectric material consists essentially of lead zirconate titanate, lead magnesium-niobate, lead nickel-niobate, lead zinc-niobate, lead manganese-niobate, lead antimony-stannate, or lead titanate.

When the green sheet, which is a piezoelectric material and which has been formed so as to slightly overhang the drive electrode 20, has been half-solidified in this way, the whole body is baked at a temperature suitable for baking the piezoelectric material, in FIG. 6 (*f*). In this baking process the central portion la of the piezoelectric vibrating element 1 may, in some cases, flex so as to project toward the pressure producing chamber 5 as shown in FIG. 5 due to the rate of contraction of the piezoelectric vibrating element 1 at the time of baking being larger than that of the drive electrode 20 and due to contraction of the portions of the piezoelectric vibrating element 1 overhanging the drive electrode 20 being larger than contraction of the piezoelectric vibrating element 1 on the drive electrode 20.

However, this type of piezoelectric vibrating element 1 is advantageous in preventing itself from being partially or completely flaked from the drive electrode 20, since the piezoelectric vibrating element 1 is bonded to the drive electrode 20 with the peripheral portions 1*b* thereof overhanging the vibrating plate 3 while extending from the drive electrode 20.

Figure 7:
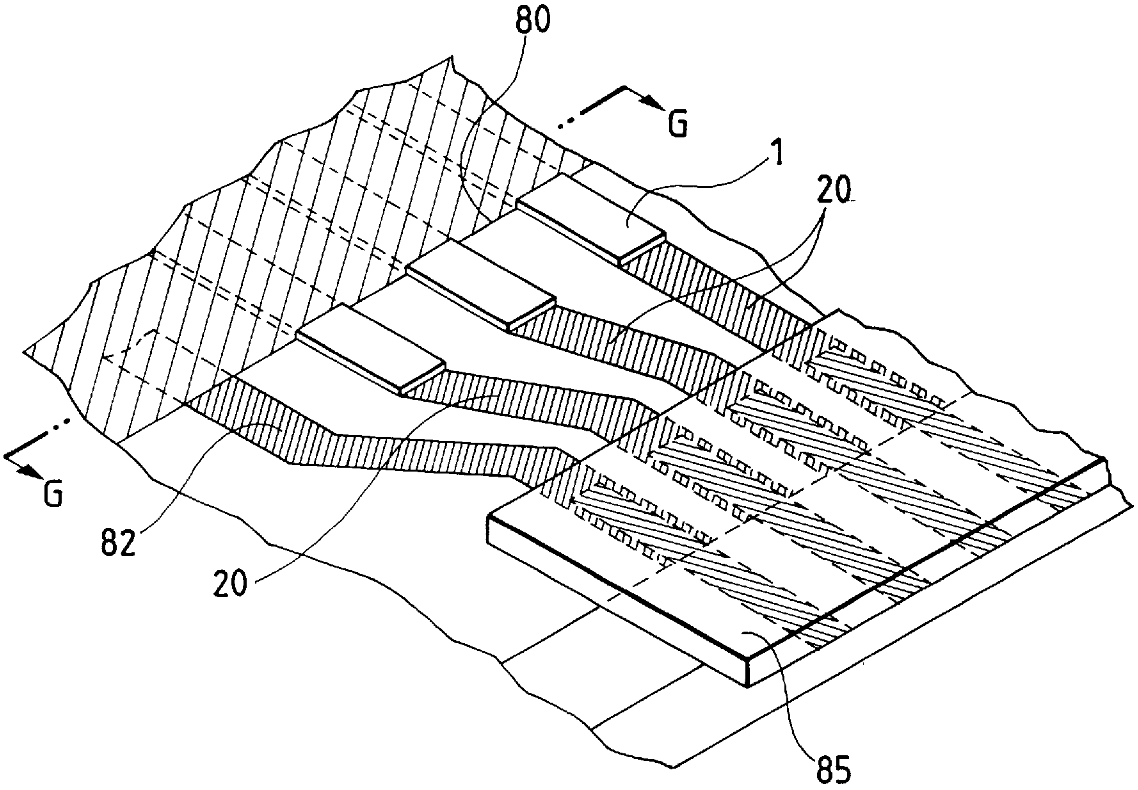
FIG. 7 is a perspective view showing the structure of the surface of the vibrating plate.

As all the baking processes have been completed in this way, the piezoelectric vibrating elements 1, 1, 1 and the common electrode 80 arranged over the piezoelectric vibrating elements are deposited over an entire region confronting the pressure producing chambers 5 by forming an electrically conducting film by means of a film forming method such as selective vapor deposition or sputtering while using an electrically conducting material, e.g., nickel or copper, with a mask as shown in FIG. 7. The common electrode 80 is connected to an external device by a cable 85 together with the drive electrodes 20, 20, 20 •• •• through a lead electrode 82.

As a result, an ink droplet can be expelled from the nozzle opening 13*a* by flexing the piezoelectric vibrating element 1 while applying a drive signal across the common electrode 80 and the drive electrode 20 positioned at the pressure producing chamber 5 from which the ink droplet is to be expelled.

Figure 8:
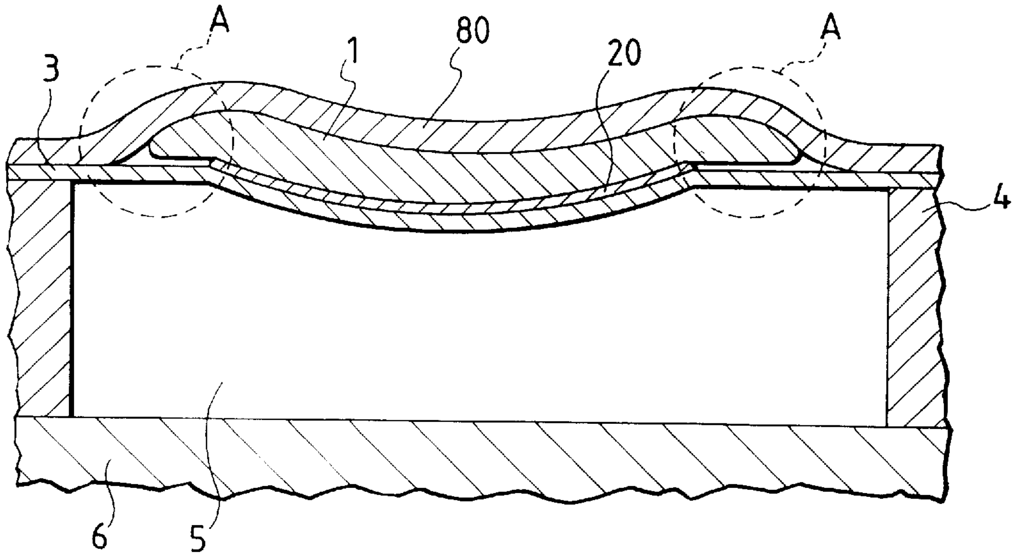
FIGS. 8 to 11 are sectional views respectively showing other embodiments of the pressure producing units used in the ink jet recording head of the invention.

The peripheral edge portions 1*b*, 1*b* of the piezoelectric vibrating element 1, i.e., the portions overhanging from the peripheral edge portions of the drive electrode 20 are bonded to the vibrating plate 3 in the above-mentioned embodiment. As shown in FIG. 8 the peripheral edges A, A of the piezoelectric vibrating element 1 are baked so as to overhang the drive electrode 20 by, e.g., preparing a slightly more solid green sheet, so that the effective operation region of the piezoelectric vibrating element 1 can be limited to the width of the drive electrode 20 itself with the reliable bondage between the piezoelectric vibrating element 1 and the drive electrode 20 well maintained.

As a result, all the pressure producing chambers 5 can be driven under a consistent condition, free from inconsistency in the vibrating characteristic caused by inconsistency in the size of the piezoelectric vibrating element 1, the size thereof tending to be inconsistent in the widthwise direction.

Figure 9:
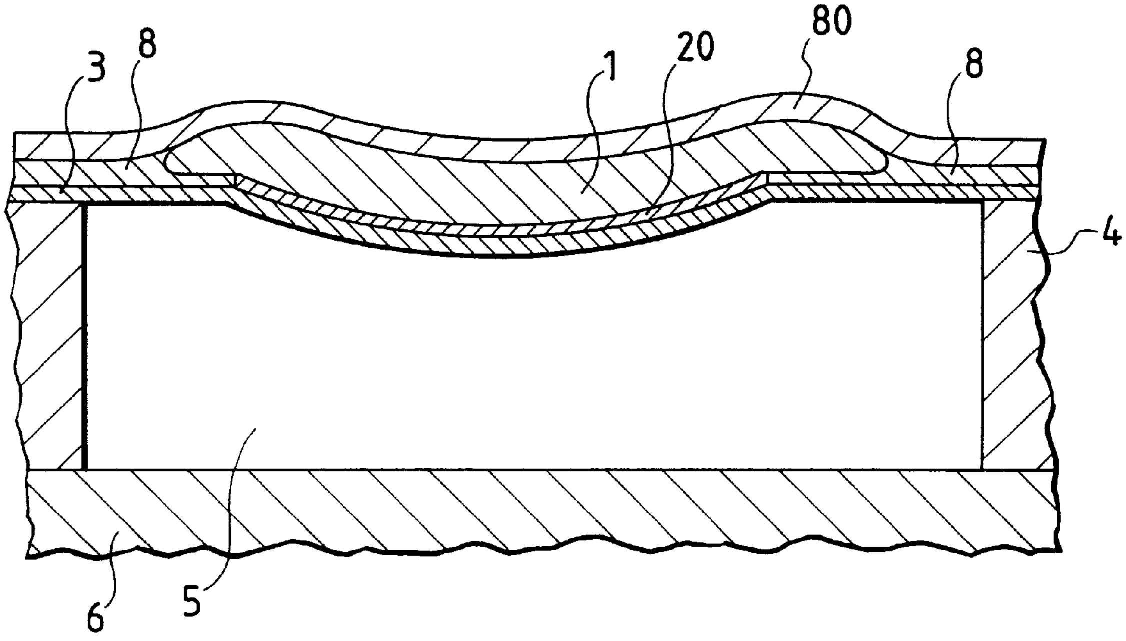

If necessary, an electrically insulating layer 8, which is thinner than the piezoelectric vibrating element 1, is formed at a region of the vibrating plate 3 where no piezoelectric vibrating element 1 is formed as shown in FIG. 9, and the common electrode 80 is deposited thereon, so that generation of crosstalk due to signal leakage can be prevented by ensuring electric insulation between the adjacent drive electrodes 20, and also breakage of the common electrode 80 at the ends of the piezoelectric vibrating element 1 can be prevented by making the step between the piezoelectric vibrating element 1 and the vibrating plate 3 small.

Figure 10:
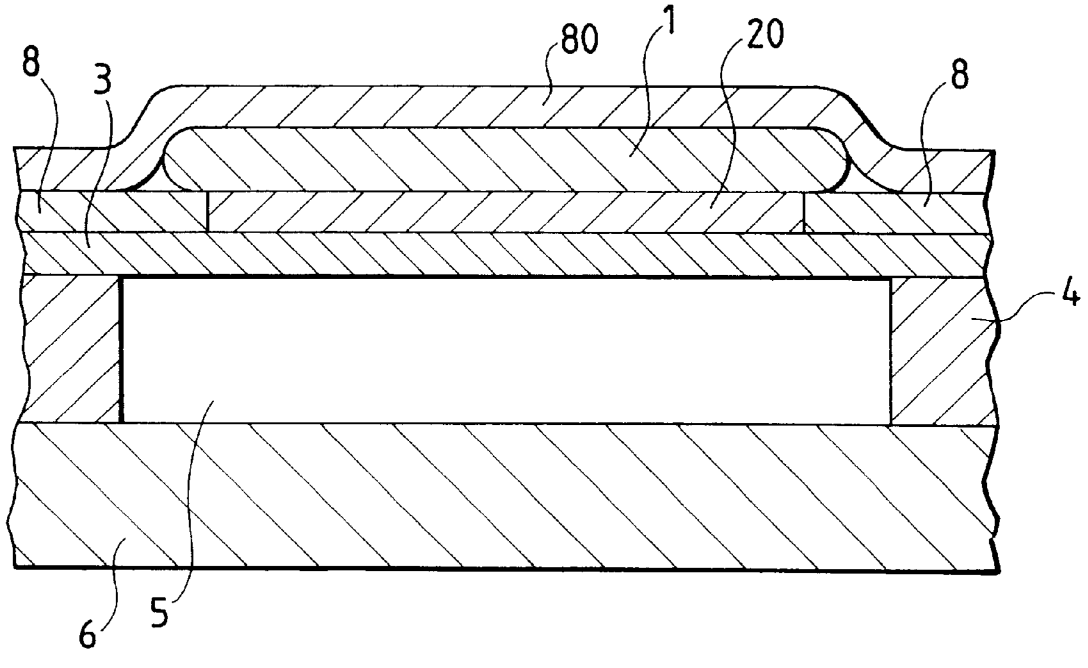

FIG. 10 shows an embodiment in which the insulating material layer 8 and the drive electrode 20 are formed on a single sheet so that the insulating material layer 8 surrounds the drive electrode 20 and so that the upper surfaces of both the insulating material layer 8 and the drive electrode 20 are flush with each other. According to this embodiment, electrically caused crosstalk can be prevented by electrically insulating the drive electrode 20 reliably, and the common electrode 80 can be formed more reliably.

Figure 11:
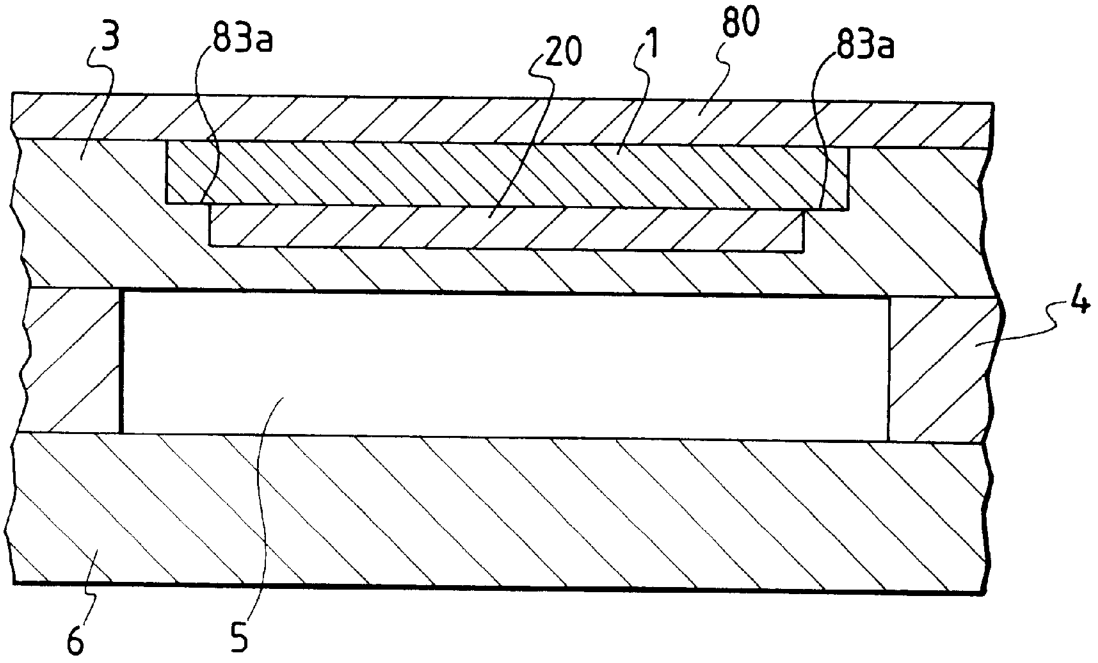

FIG. 11 shows still another embodiment of the invention. A slightly thicker ceramic material, which will become the vibrating plate 3, is prepared. In addition, a recessed portion 83 having a step 83*a* for accommodating the drive electrode 20 and the piezoelectric vibrating element 1 is formed at a central portion of each pressure producing chamber 5, so that the drive electrode 20 and the piezoelectric vibrating element 1 that is slightly wider than the drive electrode 20 are accommodated on the bottom thereof and on the top thereof, respectively, with the surface of the piezoelectric vibrating element 1 being as high as other regions of the vibrating plate 3 which have nothing to do with displacement. According to this embodiment, both mechanically caused crosstalk and electrically caused crosstalk due to signal leakage can be prevented by sufficiently reinforcing the regions having nothing to do with the displacement of the pressure producing chamber 5, and also reliability can be improved by forming the common electrode 80 so as to be stepless.

Figure 12:
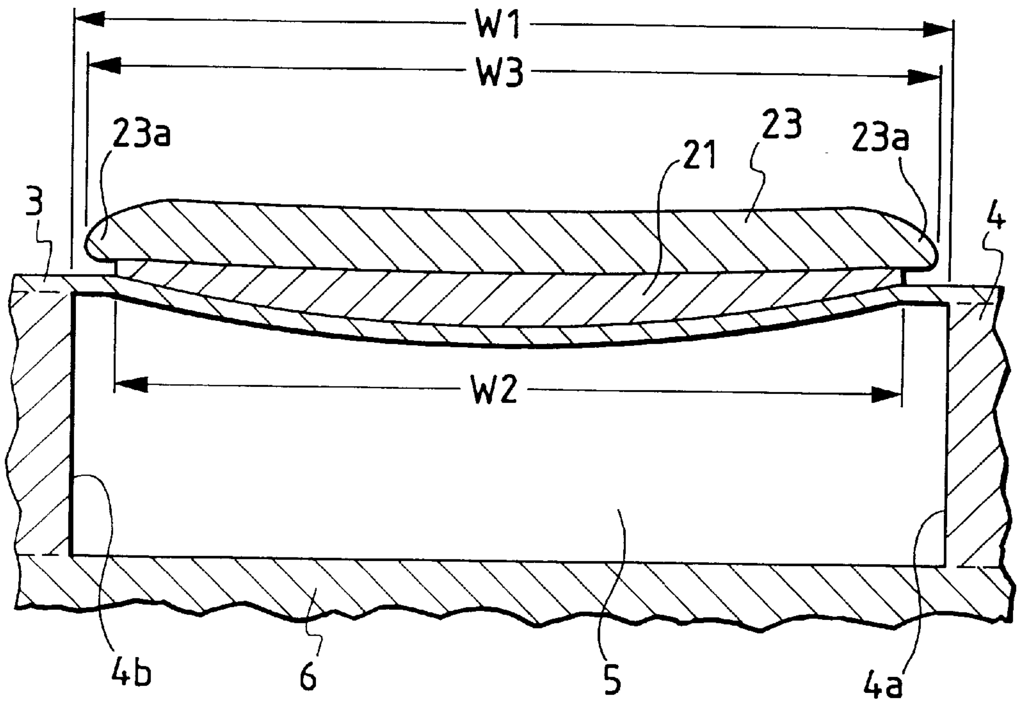
FIG. 12 is a sectional view showing another embodiment of the pressure producing unit used in the ink jet recording head of the invention.

FIG. 12 shows an ink jet recording head, which is still another embodiment of the invention. This embodiment is designed to overcome the second problem, i.e., reduction in ink expelling efficiency caused by the deformation of the piezoelectric vibrating element and the vibrating plate at the time of baking, as well as crosstalk. FIG. 12 shows the embodiment in terms of the structure of a section taken in a direction orthogonal to the stream of ink within the pressure producing chamber 5, i.e., along a line L—L of FIG. 4.

In FIG. 12 reference numeral 21 denotes a drive electrode formed on a surface of the vibrating plate 3. This drive electrode 21 is formed so that the width thereof W2 is slightly smaller than the width W1 of the pressure producing chamber 5. The drive electrode 21 is arcuate in section so that the central portion thereof in the longitudinal direction of the pressure producing chamber 5, i.e., on a line connecting the nozzle opening to the common ink chamber, is projected toward the pressure producing chamber 5 and the top thereof that is in contact with a piezoelectric vibrating element 23 is substantially horizontal.

While the drive electrode 20 discussed earlier has uniform thickness of about 5 μm in order to improve the electric property, the drive electrode 21 according to this embodiment sets the thickness of the central portion thereof to values ranging from 15 to 30 μm with flexion at the time of baking being taken in consideration, although the thickness of the peripheral edge portions is set to about 5 μm so that the electric property can be maintained.

Reference numeral 23 denotes the piezoelectric vibrating element. The width W3 of this piezoelectric vibrating element 23 is larger than the width W2 of the drive electrode 21 and smaller than the width W1 of the pressure producing chamber 5. Having such a length that the front end thereof on the nozzle opening side covers the drive electrode 21 and the rear end thereof reaches the vicinity of the rear end of the pressure producing chamber 5, the piezoelectric vibrating element 23 is formed so as to cover completely the region of the drive electrode 21 corresponding to the pressure producing chamber 5. The peripheral edge portions 23*a*, 23*a* of the piezoelectric vibrating element 23 are formed so as to overhang the drive electrode 21 in a manner similar to those in the above-mentioned embodiment.

According to this embodiment, the sectional structure of the drive electrode 21 is selected so as to fill the space formed by the above-mentioned flexion of the vibrating plate 3, the flexion being caused by the difference in the rate of contraction between the piezoelectric vibrating element 23 and the drive electrode 21 at the time of baking. Therefore, the upper surface of the drive electrode 21 is kept substantially horizontal after the baking, thereby making the piezoelectric vibrating element 23 formed on the drive electrode 21 flat also.

Figure 13:
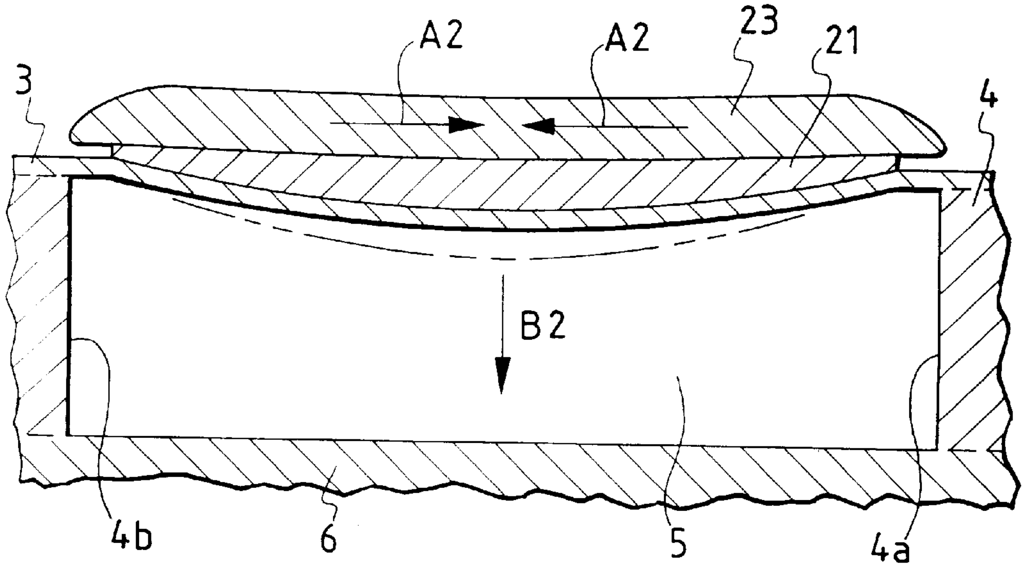
FIG. 13 is a diagram showing forces generated at the time the piezoelectric vibrating element contracts in the pressure producing unit shown in FIG. 12.
Figure 14A:
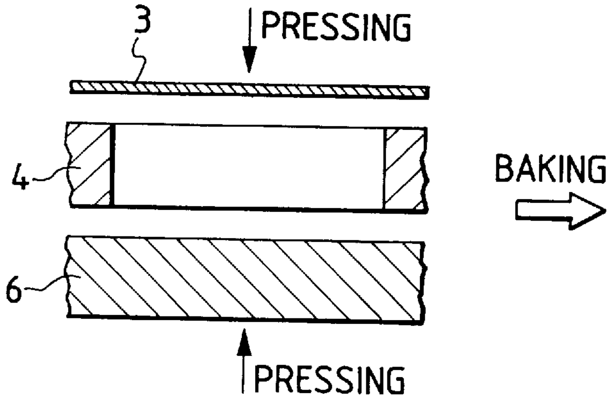
FIGS. 14 (*a*) to (*f*) are diagrams showing a method of manufacturing the pressure producing unit shown in FIG. 12.
Figure 14B:
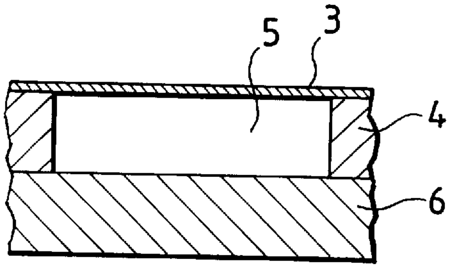
Figure 14C:
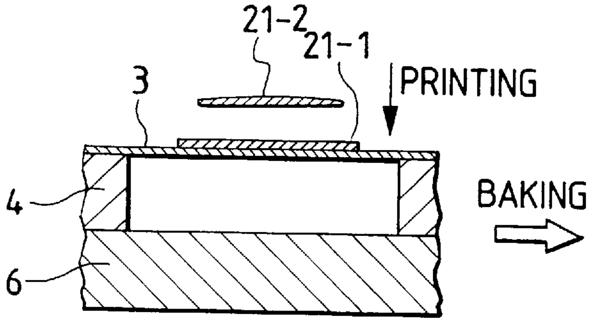
Figure 14D:
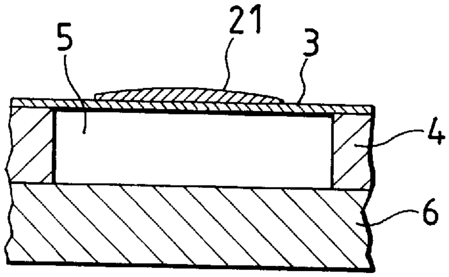
Figure 14E:
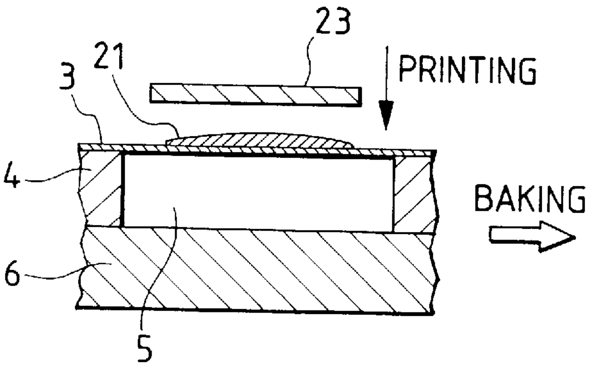
Figure 14F:
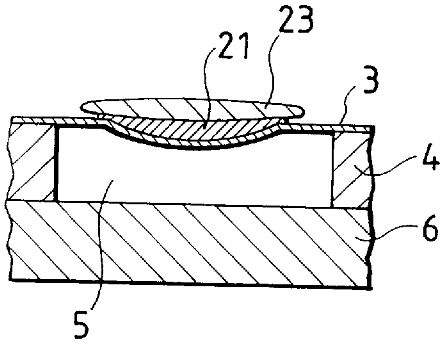

As a result, when the piezoelectric vibrating element 23 is contracted by applying a drive signal thereto, horizontally drawing forces A2, A2 are generated on the surface higher than the vibrating plate 3 as shown in FIG. 13. Although such forces are transformed into a force B2 that flexes the vibrating plate 3 toward the pressure producing chamber 5, these forces do not draw walls 4*a*, 4*b* that define the pressure producing chamber 5 toward the pressure producing chamber 5. Consequently, an ink droplet is expelled at a high efficiency, and also generation of crosstalk is controlled to an extremely small degree.

By forming the piezoelectric vibrating element 23 so as to cover the region of the drive electrode 21 confronting the pressure producing chamber 5, the region of the drive electrode 20 confronting the pressure producing chamber 5 can be covered completely by the piezoelectric vibrating element 23 even if slight displacement or inconsistency in size are present with the drive electrode 21 and the piezoelectric vibrating element 23. This prevents short-circuiting with a common electrode 80 on the other pole which is formed on the surface of the piezoelectric vibrating element 23.

In the case where the piezoelectric vibrating element 23 is formed by coating or bonding a green sheet, which is a piezoelectric material, to the drive electrode 21 and baking the green sheet together with the vibrating plate 3 and the drive electrode 21, the piezoelectric vibrating element 23 covers the drive electrode 21 completely and has peripheral edge portions 23*a*, 23*a* bonded to the drive electrode 21 reliably against the above-mentioned flexion of the vibrating plate 3 caused by the difference in the rate of contraction between the piezoelectric vibrating element 23 and the drive electrodes 21 at the time of baking. Therefore, displacement by flexion of the piezoelectric vibrating element 23 can be transmitted to the vibrating plate 3 reliably, and fatal damage such as partial flaking or the like can be prevented due to the reliable bond between the piezoelectric vibrating element 23 and the vibrating plate 3.

Specifically, a drive electrode 21, whose width W2 is 340 μm and whose thickness is 15 μm at the central portion and 5 μm at the peripheral portions with respect to a pressure producing chamber having a width W1 of 420 μm, is formed, and then a piezoelectric vibrating element 23, whose width W3 is 380 μm and whose thickness is 30 μm, is formed on the surface of the drive electrode 21.

The thus constructed ink jet recording head and an ink jet recording head in which the drive electrodes are uniformly 5 μm thick were compared. The amount of displacement of the piezoelectric vibrating element toward the pressure producing chamber is 0.2 μm in the former, whereas such amount is 0.1 μm in the latter. Therefore, an improvement that doubles the conventional amount of displacement was verified. The crosstalk of the former is 10% or less, whereas that of the latter 15 from 30 to 60%. Therefore, a reduction of ⅓ or less in crosstalk was achieved.

In a manner similar to the above-mentioned embodiment, to improve displacement efficiency of the vibrating plate 3, i.e., the ratio of the applied electric energy to the ink removing volume, it is preferable to adjust the ratio of the width W1 of the pressure producing chamber 5 to the width W2 of the drive electrode 21, W2/W1, which is ideally set to 0.9, to a value between 0.8 and 0.9 considering errors and variations in the-manufacturing process. Further, the thickness of the drive electrode 21 at the central portion is set to a value 1.2 times the thickness thereof or more at the peripheral portions. It has been verified that such setting contributes to preventing the reduction in yield due to errors and the like in the manufacturing process with certainty.

A method of manufacturing the thus constructed ink jet recording head will be described next with reference to FIGS. 14 (*a*) to (*f*).

The vibrating plate 3, the pressure producing chamber forming member 4, and the pressure producing chamber forming cover member 6 are formed of green sheets, each green sheet being a ceramic material, i.e., a clay-like sheet, and the pressure producing chamber forming member 4 having windows formed by punching at regions designed to serve as the pressure producing chambers 5. Pressure is applied to the green sheets with these members half-solidified so that these members are integrated with one another, in FIG. 14 (*a*). Then, the processed body is baked at temperatures ranging from 800 to 1500° C., in FIG. 14 (*b*). The ceramic material generally consists essentially of one kind or more of a compound selected from the group consisting of aluminum oxide, zirconium oxide, magnesium oxide, aluminum nitride, and silicon nitride.

When the vibrating plate 3, the pressure producing chamber forming member 4, and the pressure producing chamber forming cover member 6 have been integrated in this way, a pattern of the drive electrode 21 having an optimal width with respect to the corresponding pressure producing chamber 5 is formed by coating or printing an electrically conducting material on a region of the vibrating plate 3 corresponding to the pressure producing chamber 5 so that the ratio of the width W2 of the drive electrode 21 to the width W1 of the pressure producing chamber 5, W2/W1, is set to a value between 0.8 and 0.9. The electrically conducting material consists essentially of one kind or more of an alloy selected from the group consisting of platinum, palladium, silver-palladium, silver-platinum, and platinum-palladium. Since the drive electrode 21 must be made arcuate in section in this embodiment, a first layer 21-1 is coated to a predetermined thickness and a second layer 21-2 is thereafter coated only in the vicinity of the center. This coating technique allows the electrically conducting material of which the second layer 21-2 is made to smoothly spread with the central portion thereof as the apex while promoted by the fluidity of the material of which the electrode is made, so that the second layer 21-2 is fused with the first layer 21-1 to be integrated therewith and to have an arcuate section, in FIG. 14 (*c*).

As the pattern of the drive electrode 21 has been half-solidified on the vibrating plate 3, the whole body is baked at a temperature suitable for baking the electrically conducting material, in FIG. 14 (d).

Then, the piezoelectric vibrating element 23 is formed on the surface of the drive electrode 21 by coating or printing a green sheet consisting of a piezoelectric material so that the width of the piezoelectric vibrating element 23 is larger than the width of the drive electrode 21 formed on the surface of the vibrating plate 3 and smaller than the width of the pressure producing chamber 5, in FIG. 14 (*e*). The piezoelectric material consists essentially of lead zirconate titanate, lead magnesium-niobate, lead nickel-niobate, lead zinc-niobate, lead manganese-niobate, lead antimony-stannate, or lead titanate.

When the green sheet, which is a piezoelectric material and which has been formed so as to be slightly projected from the drive electrode 21, has been half-solidified in this way, the whole body is baked at a temperature suitable for baking the piezoelectric material, in FIG. 14 (*f*).

In this baking process the central portion of the vibrating plate 3 flexes toward the pressure producing chamber 5 due to the rate of contraction of the piezoelectric vibrating element 23 at the time of baking being larger than that of the drive electrode 21 and due to contraction on the outer side of the piezoelectric vibrating element 23 being larger than contraction on the drive electrode 21 side of the piezoelectric vibrating element 23. However, since the central portion of the drive electrode 21 which has been formed thicker in advance fills the space formed by the flexion, the surface of the drive electrode 21 can be made horizontal.

When the electrode layer is formed by coating, the thickness of the layer usually includes about 20% inconsistency. Therefore, it is preferable to make the central portion 1.2 or more times thicker than the peripheral portion, taking the safety factor into consideration. This technique is quite helpful in improving yield.

As the piezoelectric vibrating element baking process has been completed in this way, the common electrode 80 is formed by depositing an electrically conducting material, e.g., copper or nickel, using a mask having a window covering the surfaces of all the piezoelectric vibrating elements 23, as shown in FIG. 7.

Figure 15:
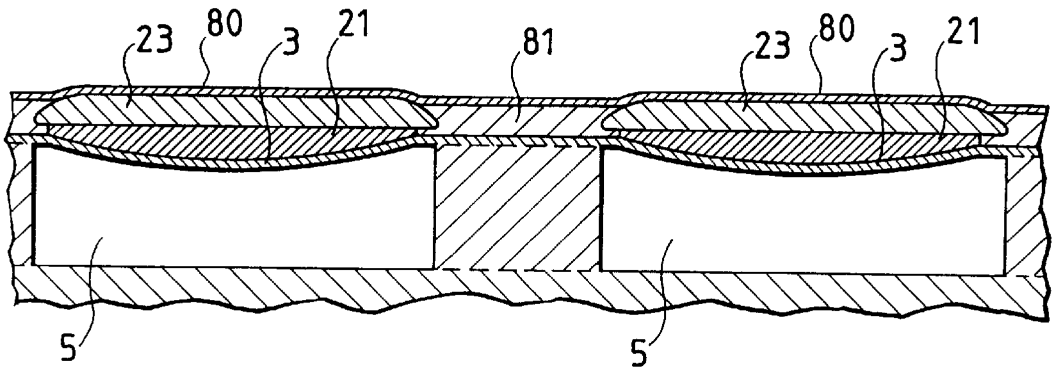
FIGS. 15 to 17 are sectional views respectively showing other embodiments of the pressure producing units used in the ink jet recording head of the invention.

If necessary, a thin electrically insulating layer 81 is used to fill regions of the vibrating plate 3 where no piezoelectric vibrating element 23 is formed so that the layer 81 becomes as high as the piezoelectric vibrating element 23 as shown in FIG. 15, and the common electrode 80 is deposited thereon, so that generation of crosstalk due to signal leakage can be prevented by securing electric insulation between the adjacent drive electrodes 21, and breakage of the common electrode 80 at the ends of the piezoelectric vibrating element 23 can be prevented by making the step between the piezoelectric vibrating element 23 and the vibrating plate 3 small.

Figure 16:
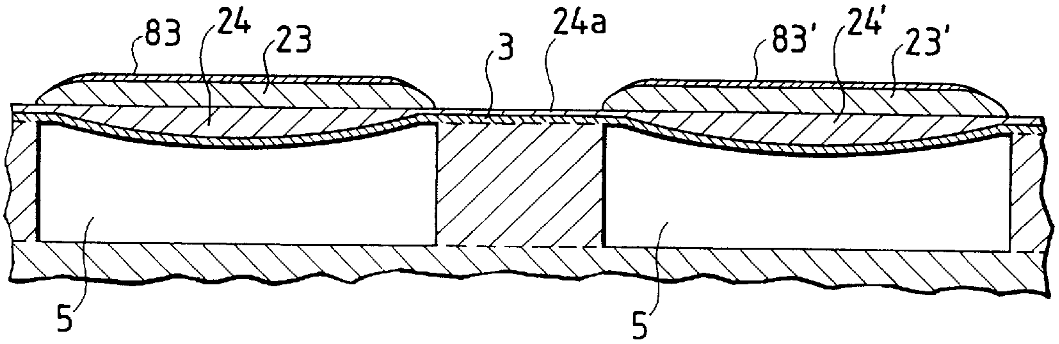

FIG. 16 shows another embodiment. An electrode 24 formed so as to confront the pressure producing chamber 5 is similarly made arcuate in section at a region confronting the pressure producing chamber 5. On the other hand, a region 24*a* is formed at other regions and extends uniformly at such a thickness as to ensure electric conduction. This region 24*a* is connected to an electrode 24' formed on an adjacent pressure producing chamber 5. That is, the electrodes that were used to drive the piezoelectric vibrating elements 23 in the above-mentioned embodiments are used as the common electrodes, and drive electrodes 83, 83' that are electrically independent of the piezoelectric vibrating elements 23, 23' are formed on the surfaces of the respective piezoelectric vibrating elements 23, 23'.

While the surface of the drive electrode is made flat by filling the recess formed by the flexion of the vibrating plate 3 with the electrically conducting material, a similar effect can be obtained by using other materials.

Figure 17:
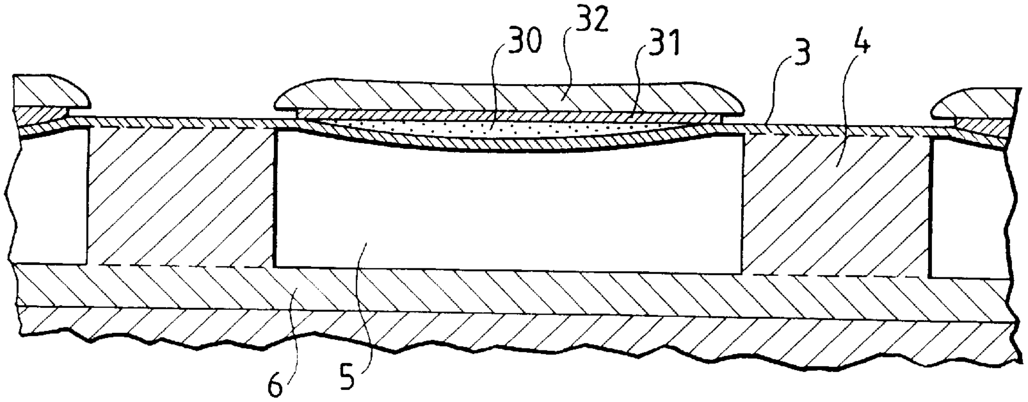
Figure 18A:
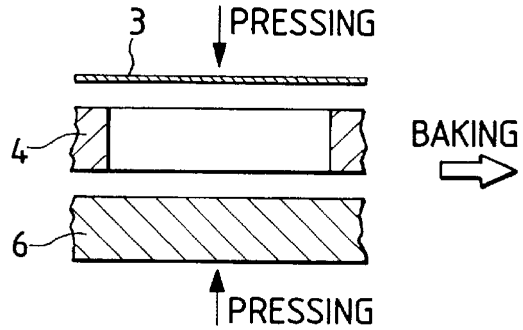
FIGS. 18 (*a*) to (*h*) are diagrams showing a method of manufacturing the pressure producing unit shown in FIG. 17.
Figure 18B:
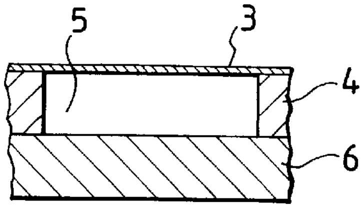
Figure 18C:
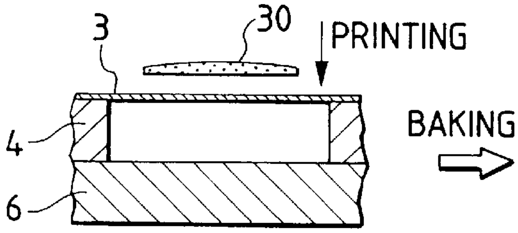
Figure 18D:
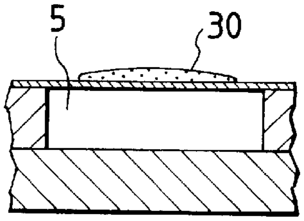
Figure 18E:
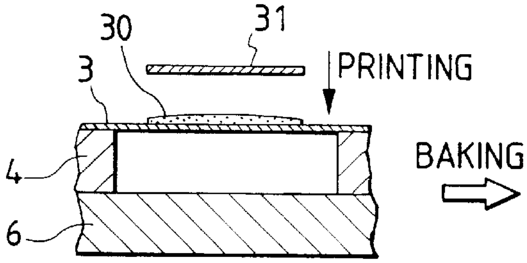
Figure 18F:
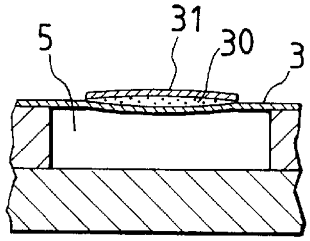
Figure 18G:
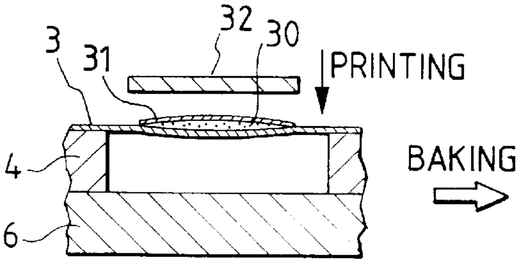
Figure 18H:
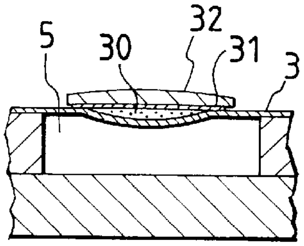
Figure 19:
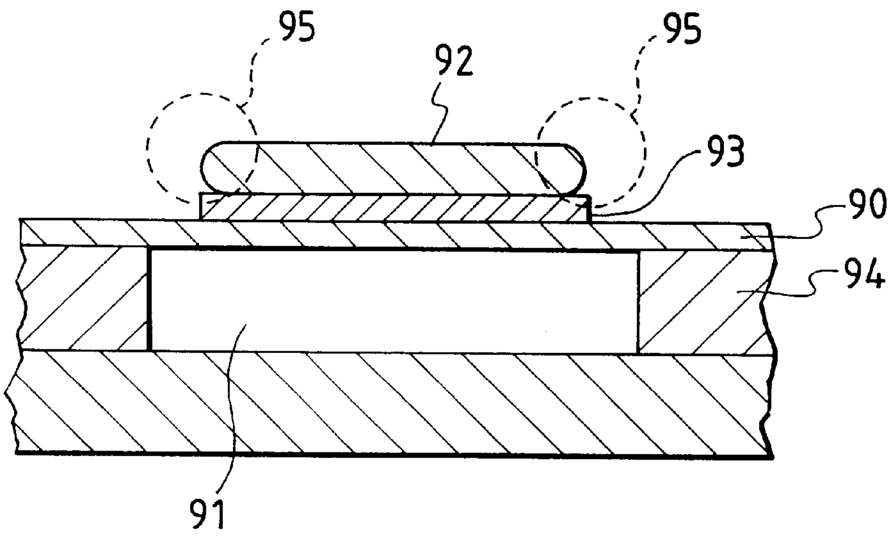
FIGS. 19 and 20 are sectional views respectively showing relationships between the drive electrode and the piezoelectric vibrating element in a conventional pressure producing unit in which the drive electrode and the piezoelectric vibrating element are manufactured integrally by baking.
Figure 20:
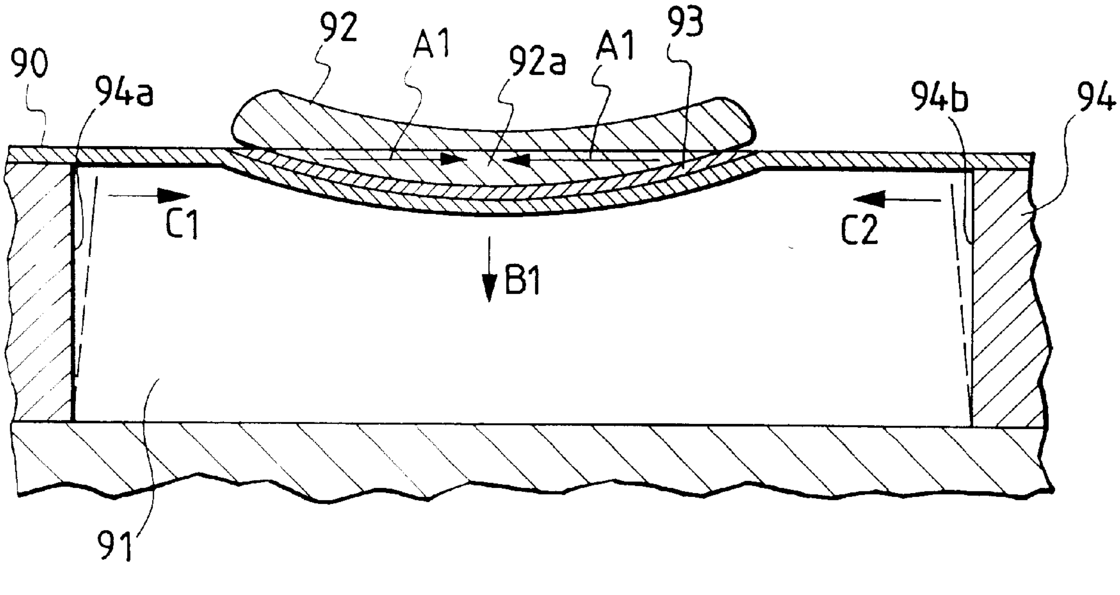

FIG. 17 shows still another embodiment of the invention A third layer 30 is formed and a drive electrode 31 is formed thereon. The third layer 30 is made of a material other than the piezoelectric material and which has strong adhesion with respect to both the vibrating plate 3 and the electrode. The third layer 30 is formed so as to be arcuate in section so that the central portion of the vibrating plate 3 confronting the pressure producing chambers is thick with a smoothly thinning slope toward the peripheral portions. The drive electrode 31 corrects the flexion of the vibrating plate 3, and similarly has a narrower width than the pressure producing chamber and a uniform thickness.

Also in this embodiment, the piezoelectric vibrating element 32 is formed so as to be substantially horizontal at a level higher than the vibrating plate 3. Therefore, generation of crosstalk and reduction in ink expelling efficiency can be prevented.

FIGS. 18 (*a*) to (*h*) show a method of manufacturing the above-mentioned recording head, the method being an embodiment of the invention. Pressure is applied to the vibrating plate 3, the pressure producing chamber forming member 4, and the pressure producing chamber forming cover member 6, which are in the form of green sheets, and the sheets are integrally baked at temperatures ranging from 800 to 1500° C., in FIGS. 18 (*a*) and (*b*). The pressure producing chamber forming member 4 has portions formed by punching and designed to serve as the pressure producing chambers 5. Each green sheet is a ceramic such as alumina or zirconia.

The third layer 30 that is thicker at the central portion than the peripheral portion is formed at a region corresponding to the pressure producing chamber 5 by printing, in FIG. 18 (*c*), and baked, in FIG. 18 (*d*). The third layer 30 is made of a material other than the piezoelectric material and which has adhesion with respect to both the vibrating plate 3 and the electrode 31, e.g., ceramic or metal.

In these processes, it is similarly preferable to form the central portion 1.2 times thicker than the peripheral portions, taking errors in the manufacturing process into account.

Then, the material of which the electrode 31 is made is deposited on the surface of the third layer 30 so as to confront the pressure producing chamber 5 by printing, in FIG. 14 (*e*), and baked, in FIG. 18 (*f*).

As the final process, the piezoelectric vibrating element 32 is similarly formed by printing, in FIG. 18 (*g*), and baked, in FIG. 18 (*h*).

According to this embodiment, freedom in selecting the material used to compensate for the deformation of the vibrating plate 3 is increased, thereby allowing the vibrating characteristic of the vibrating plate 3 to be adjusted to a value optimal for ink expelling.

What is claimed is:

1. A method of manufacturing an ink jet recording head, comprising:

forming a vibrating plate, a pressure chamber forming member, and a cover member of green sheets, respectively, the pressure chamber forming member having windows that form pressure chambers, each of the green sheets being made of a ceramic material;

applying pressure to, and baking, the vibrating plate, the pressure chamber forming member, and the cover member;

forming an electrode on the vibrating plate at a position corresponding to one of the pressure chambers, wherein a ratio of a width W2 of the electrode to a width W1 of the pressure chamber, W2/W1, is a value between 0.8 and 0.9; and forming a piezoelectric vibrating element over the electrode, the piezoelectric vibrating element being wider than the width W2 of the electrode and narrower than the width W1 of the pressure producing chamber.

2. A method of manufacturing an ink jet recording head according to claim 1, wherein the ceramic material is one or more compounds selected from the group consisting of aluminum oxide, zirconium oxide, magnesium oxide, aluminum nitride, and silicon nitride, the piezoelectric vibrating element consists essentially of lead zirconate titanate, lead magnesium-niobate, lead nickel-niobate, lead manganese-niobate, lead antimony-stannate, or lead titanate, and the electrode consists essentially of one or more metals or alloys selected from the group consisting of platinum, palladium, silver-palladium, silver-platinum, and platinum-palladium.

3. A method of manufacturing an ink jet recording head, comprising:

forming a vibrating plate, a pressure chamber forming member, and a cover member of green sheets, respectively, the pressure chamber forming member having windows that form pressure chambers, each of the green sheets being made of a ceramic material;

applying pressure to, and baking, the vibrating plate, the pressure chamber forming member, and the cover member;

forming an electrode on the vibrating plate at a position corresponding to one of the pressure chambers, wherein a ratio of a width W2 of the electrode to a width W1 of the pressure chamber, W2/W1, is a value between 0.8 and 0.9, and a central portion of the electrode is arcuate in section and projects toward said one of the pressure chambers; and forming a piezoelectric vibrating element over the electrode, the piezoelectric vibrating element being wider than the width W2 of the electrode and narrower than the width W1 of the pressure producing chamber.

4. A method of manufacturing an ink jet recording head according to claim 3, wherein said step of forming the electrode comprises applying at least two layers of electrically conducting material on the vibrating plate.

5. A method of manufacturing an ink jet recording head, comprising:

forming a vibrating plate, a pressure chamber forming member, and a cover member of green sheets, respectively, the pressure chamber forming member having windows that form pressure chambers, each of the green sheets being made of a ceramic material;

applying pressure to, and baking, the vibrating plate, the pressure chamber forming member, and the cover member;

forming a layer of material on the vibrating plate at a position corresponding to one of the pressure chambers, and forming an electrode over the layer of material, the layer of material having an adhesive force with respect to the vibrating plate and the electrode, and the layer of material being arcuate in section so that a central portion of the vibrating plate is projected toward said one of said pressure chambers;

the electrode being formed over the layer of material so that a ratio of a width W2 of the electrode to a width W1 of the pressure chamber, W2/W1, is a value between 0.8 and 0.9; and forming a piezoelectric vibrating element over the electrode, the piezoelectric vibrating element being wider than the width W2 of the electrode and narrower than the width W1 of the pressure producing chamber.

6. A method of manufacturing an ink jet recording head according to claim 3, wherein the ceramic material is one or more compounds selected from the group consisting of aluminum oxide, zirconium oxide, magnesium oxide, aluminum nitride, and silicon nitride, the piezoelectric vibrating element consists essentially of lead zirconate titanate, lead magnesium-niobate, lead nickel-niobate, lead manganese-niobate, lead antimony-stannate, or lead titanate, and the electrode consists essentially of one or more metals or alloys selected from the group consisting of platinum, palladium, silver-palladium, silver-platinum, and platinum-palladium.

7. A method of manufacturing an ink jet recording head according to claim 5, wherein the ceramic material is one or more compounds selected from the group consisting of aluminum oxide, zirconium oxide, magnesium oxide, aluminum nitride, and silicon nitride, the piezoelectric vibrating element consists essentially of lead zirconate titanate, lead magnesium-niobate, lead nickel-niobate, lead manganese-niobate, lead antimony-stannate, or lead titanate, and the electrode consists essentially of one or more metals or alloys selected from the group consisting of platinum, palladium, silver-palladium, silver-platinum, and platinum-palladium.

8. A method of manufacturing an ink jet recording head, comprising:

forming a vibrating plate, a pressure chamber forming member, and a cover member of green sheets, respectively, the pressure chamber forming member having windows that form pressure chambers, each of the green sheets being made of a ceramic material;

applying pressure to, and baking, the vibrating plate, the pressure chamber forming member, and the cover member;

forming an electrode on the vibrating plate at a position corresponding to one of the pressure chambers; and forming a piezoelectric vibrating element over the electrode, the piezoelectric vibrating element being wider than the width W2 of the electrode and narrower than the width W1 of the pressure producing chamber.

9. A method of manufacturing an ink jet recording head according to claim 8, wherein the ceramic material is one or more compounds selected from the group consisting of aluminum oxide, zirconium oxide, magnesium oxide, aluminum nitride, and silicon nitride, the piezoelectric vibrating element consists essentially of lead zirconate titanate, lead magnesium-niobate, lead nickel-niobate, lead manganese-niobate, lead antimony-stannate, or lead titanate, and the electrode consists essentially of one or more metals or alloys selected from the group consisting of platinum, palladium, silver-palladium, silver-platinum, and platinum-palladium.

10. A method of manufacturing an ink jet recording head, comprising:

forming a vibrating plate, a pressure chamber forming member, and a cover member of green sheets, respectively, the pressure chamber forming member having windows that form pressure chambers, each of the green sheets being made of a ceramic material;

applying pressure to, and baking, the vibrating plate, the pressure chamber forming member, and the cover member;

forming an electrode on the vibrating plate at a position corresponding to one of the pressure chambers, wherein a central portion of the electrode is arcuate in section and projects toward said one of the pressure chambers; and forming a piezoelectric vibrating element over the electrode, the piezoelectric vibrating element being wider than the width W2 of the electrode and narrower than the width W1 of the pressure producing chamber.

11. A method of manufacturing an ink jet recording head according to claim 10, wherein said step of forming the electrode comprises applying at least two layers of electrically conducting material on the vibrating plate.

12. A method of manufacturing an ink jet recording head, comprising:

forming a vibrating plate, a pressure chamber forming member, and a cover member of green sheets, respectively, the pressure chamber forming member having windows that form pressure chambers, each of the green sheets being made of a ceramic material;

applying pressure to, and baking, the vibrating plate, the pressure chamber forming member, and the cover member;

forming a layer of material on the vibrating plate at a position corresponding to one of the pressure chambers, and forming an electrode over the layer of material, the layer of material having an adhesive force with respect to the vibrating plate and the electrode, and the layer of material being arcuate in section so that a central portion of the vibrating plate is projected toward said one of said pressure chambers;

the electrode being formed over the layer of material; and forming a piezoelectric vibrating element over the electrode, the piezoelectric vibrating element being wider than the width W2 of the electrode and narrower than the width W1 of the pressure producing chamber.

13. A method of manufacturing an ink jet recording head according to claim 10, wherein the ceramic material is one or more compounds selected from the group consisting of aluminum oxide, zirconium oxide, magnesium oxide, aluminum nitride, and silicon nitride, the piezoelectric vibrating element consists essentially of lead zirconate titanate, lead magnesium-niobate, lead nickel-niobate, lead manganese-niobate, lead antimony-stannate, or lead titanate, and the electrode consists essentially of one or more metals or alloys selected from the group consisting of platinum, palladium, silver-palladium, silver-platinum, and platinum-palladium.

14. A method of manufacturing an ink jet recording head according to claim 12, wherein the ceramic material is one or more compounds selected from the group consisting of aluminum oxide, zirconium oxide, magnesium oxide, aluminum nitride, and silicon nitride, the piezoelectric vibrating element consists essentially of lead zirconate titanate, lead magnesium-niobate, lead nickel-niobate, lead manganese-niobate, lead antimony-stannate, or lead titanate, and the electrode consists essentially of one or more metals or alloys selected from the group consisting of platinum, palladium, silver-palladium, silver-platinum, and platinum-palladium.

* * * * *